US011824390B2

(12) United States Patent
Kobayashi

(10) Patent No.: US 11,824,390 B2
(45) Date of Patent: Nov. 21, 2023

(54) BATTERY MONITORING SYSTEM PROVIDED WITH BATTERY MONITORING CONTROL CIRCUIT FOR REDUCING CONSUMPTION POWER IN SLEEP STATE

(71) Applicant: NUVOTON TECHNOLOGY CORPORATION JAPAN, Kyoto (JP)

(72) Inventor: Hitoshi Kobayashi, Hirakata (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 274 days.

(21) Appl. No.: 17/349,437

(22) Filed: Jun. 16, 2021

(65) Prior Publication Data

US 2021/0313815 A1 Oct. 7, 2021

Related U.S. Application Data

(63) Continuation of application No. PCT/JP2019/046838, filed on Nov. 29, 2019.

(30) Foreign Application Priority Data

Dec. 17, 2018 (JP) ................................ 2018-235658

(51) Int. Cl.
*G01R 31/00* (2006.01)
*H02J 7/00* (2006.01)
(Continued)

(52) U.S. Cl.
CPC .......... *H02J 7/0047* (2013.01); *G01R 31/396* (2019.01); *H01M 10/48* (2013.01); *H02J 7/0013* (2013.01)

(58) Field of Classification Search
CPC ...... G01R 31/00; G01R 31/396; H02J 7/0047
(Continued)

(56) References Cited

U.S. PATENT DOCUMENTS 6,034,489 A * 3/2000 Weng .................. H02M 1/4258
315/307
9,356,451 B2 * 5/2016 Kawahara ............. H02J 7/0048
(Continued)

FOREIGN PATENT DOCUMENTS

JP 2003-070179 A 3/2003
JP 2005-318751 A 11/2005
(Continued)

OTHER PUBLICATIONS

English translation of International Preliminary Report on Patentability issued in International Application No. PCT/JP2019/046838, dated Jul. 1, 2021.
(Continued)

*Primary Examiner* — Vincent Q Nguyen
(74) *Attorney, Agent, or Firm* — McDermott Will & Emery LLP

(57) ABSTRACT

A battery control system is provided with battery monitoring control circuits for measuring an output voltage of an individual or secondary battery cells, which are connected in an assembled battery divided into blocks; and a control circuit for controlling the battery monitoring control circuits. Each of the batter monitoring control circuits includes a communication interface for communications between the battery monitoring control circuits or communications with the control circuit; a power converter for converting a start-up signal into a DC voltage; and a start-up circuit that receives the DC voltage and generates a start-up control signal for starting the battery monitoring control circuit. The communication interface is a daisy-chain communication interface that connects the plurality of battery monitoring control circuits in a daisy chain, and one of the plurality of battery monitoring control circuits starts another one of the
(Continued)

plurality of battery monitoring control circuits based on the start-up signal.

9 Claims, 9 Drawing Sheets

(51) Int. Cl.
    *G01R 31/396*    (2019.01)
    *H01M 10/48*    (2006.01)
(58) Field of Classification Search
    USPC .......................................... 324/426, 432–435
    See application file for complete search history.

(56) References Cited

U.S. PATENT DOCUMENTS

| | | | |
|---|---|---|---|
| 2003/0044689 | A1 | 3/2003 | Miyazaki et al. |
| 2005/0062456 | A1* | 3/2005 | Stone ............... H02J 7/0019 320/116 |
| 2005/0242776 | A1* | 11/2005 | Emori ............... B60L 58/22 320/116 |
| 2010/0079146 | A1 | 4/2010 | Kurose et al. |
| 2013/0307551 | A1 | 11/2013 | Makino |
| 2014/0191765 | A1 | 7/2014 | Takeshita |

FOREIGN PATENT DOCUMENTS

| | | |
|---|---|---|
| JP | 2008-312391 A | 12/2008 |
| JP | 2010-081756 A | 4/2010 |
| JP | 2013-238472 A | 11/2013 |
| JP | 2014-134454 A | 7/2014 |

OTHER PUBLICATIONS

International Search Report issued in International Patent Application No. PCT/JP2019/046838, dated Feb. 4, 2020; with English translation.

* cited by examiner

BATTERY MONITORING SYSTEM PROVIDED WITH BATTERY MONITORING CONTROL CIRCUIT FOR REDUCING CONSUMPTION POWER IN SLEEP STATE

CROSS-REFERENCE TO RELATED APPLICATIONS

This is a Continuation application based on PCT application No. PCT/JP2019/046838 as filed on Nov. 29, 2019, which claims priority to Japanese patent application No. JP2018-235658 as filed on Dec. 17, 2018, the contents of which are incorporated herein by reference.

BACKGROUND OF THE DISCLOSURE

1. Field of the Disclosure

The present disclosure relates to a battery monitoring system provided with a battery monitoring control circuit for reducing a consumption power in a sleep mode.

2. Description of Related Art

For example, Patent Document 1 discloses a battery monitoring system capable of saving the electric power by stopping the operation of voltage generating means in a power saving mode.

The battery monitoring system according to a prior example disclosed in Patent Document 1 includes a plurality of start-up circuits that control starting of a regulator. The plurality of start-up circuits include a start-up circuit that outputs an L-level power-up signal for starting the regulator according to a start-up signal inputted from an MCU of a control circuit unit. In addition, the plurality of start-up circuits include a start-up circuit that outputs an L-level power-up signal for starting the regulator according to a voltage potential VDD generated by a regulator of a lower or upper battery monitoring IC 20 that has been started previously.

PRIOR ART DOCUMENT

Patent Document

Patent Document 1: Japanese Patent Laid-open Publication No. JP2014-134454A.

However, the prior example has such a problem that the electric power consumption in a sleep mode is still large.

SUMMARY OF THE DISCLOSURE

An object of the present disclosure is to solve the above problem and to provide a battery monitoring control circuit that can achieve zero power consumption in a sleep state before starting the battery monitoring control circuit, and a battery control system equipped with the battery monitoring control circuit.

According to one aspect of the present disclosure, there is provided a battery monitoring control circuit for use in a battery control system including a plurality of battery monitoring control circuits, and a control circuit configured to control the plurality of battery monitoring control circuits. The plurality of battery control circuits is configured to measure an output voltage of an individual or a plurality of secondary battery cells, and the plurality of secondary battery cells is connected in an assembled battery that is divided into a plurality of blocks. Each of the plurality of battery monitoring control circuits includes a communication interface, a power converter that converts a start-up signal inputted to the communication interface into a DC voltage, and a start-up circuit. The communication interface performs communications between the plurality of battery monitoring control circuits or communications with the control circuit. The start-up circuit receives the DC voltage from the power converter as a power source voltage, and generates a start-up control signal for starting the battery monitoring control circuit. The communication interface is a daisy-chain communication interface that connects the plurality of battery monitoring control circuits in a daisy chain, and one of the plurality of battery monitoring control circuits starts another one of the plurality of battery monitoring control circuits based on the start-up signal.

According to another aspect of the present disclosure, there is provided a battery control system including a plurality of battery monitoring control circuits, and a control circuit configured to control the plurality of battery monitoring control circuits. The plurality of battery control circuits is configured to measure an output voltage of an individual or a plurality of secondary battery cells, and the plurality of secondary battery cells is connected in an assembled battery that is divided into a plurality of blocks. Each of the plurality of battery monitoring control circuits includes a communication interface, a power converter that converts a start-up signal inputted to the communication interface into a DC voltage, and a start-up circuit. The communication interface performs communications between the plurality of battery monitoring control circuits or communications with the control circuit. The start-up circuit receives the DC voltage from the power converter as a power source voltage, and generates a start-up control signal for starting the battery monitoring control circuit. The communication interface is a daisy-chain communication interface that connects the plurality of battery monitoring control circuits in a daisy chain, and one of the plurality of battery monitoring control circuits starts another one of the plurality of battery monitoring control circuits based on the start-up signal.

Therefore, according to the present disclosure, the power converter converts a start-up signal inputted to the communication interface into the DC voltage, and the start-up circuit receives the DC voltage from the power converter as the power source voltage and generate the start-up control signal for starting the battery monitoring control circuit. As a result, since the battery monitoring control circuit starts by the start-up control signal, the electric power consumption in the sleep state before the battery monitoring control circuit starts can be reduced to zero.

DETAILED DESCRIPTION OF EMBODIMENTS

Figure 1:
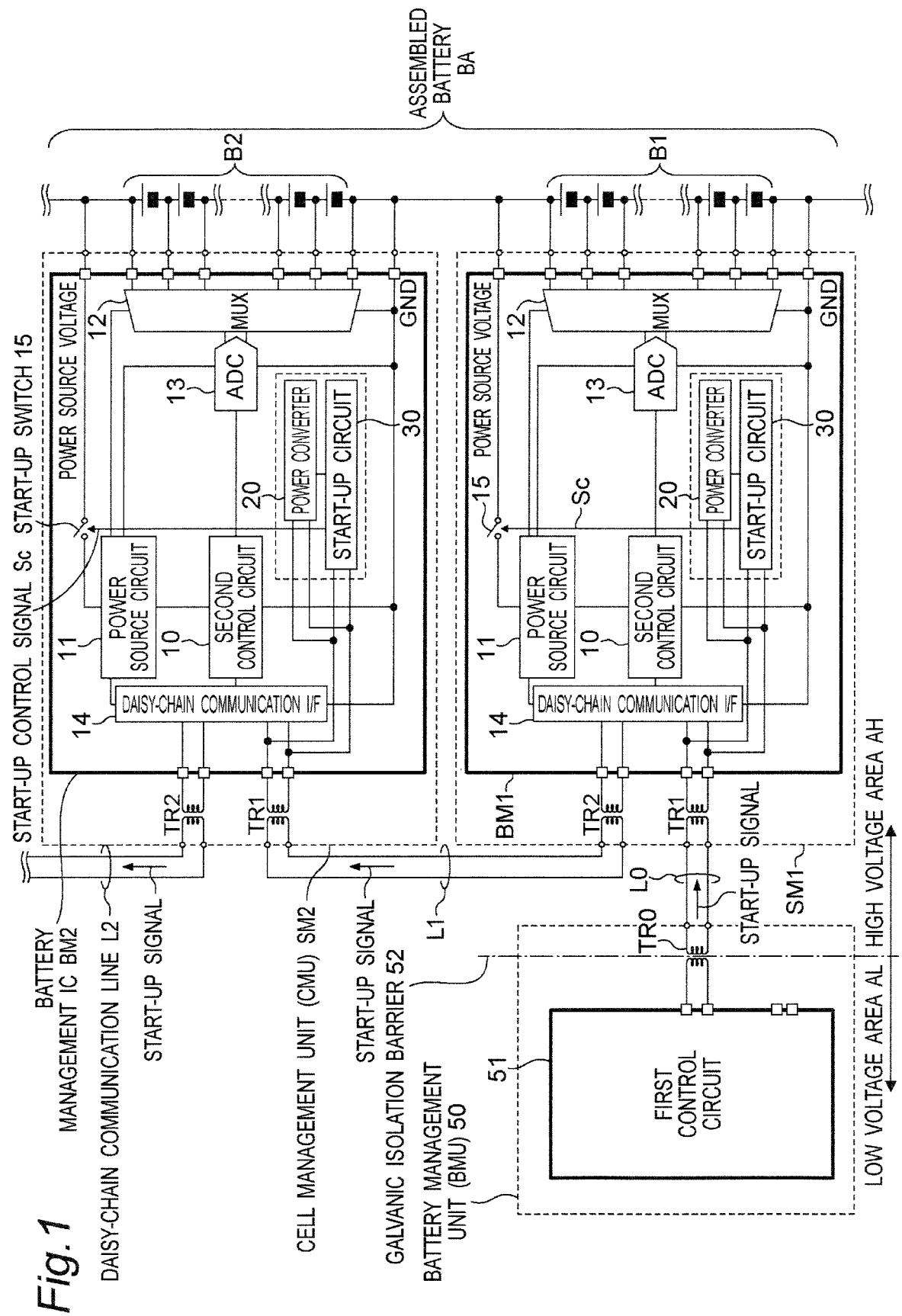
FIG. 1 is a block diagram illustrating an example of a configuration of a battery control system including a battery monitoring control circuit according to an embodiment.

Hereinafter, embodiments according to the present disclosure will be described with reference to the drawings. Same reference numerals are given to the same or similar components.

Embodiments

FIG. 1 is a block diagram illustrating an example of a configuration of a battery control system including a battery monitoring control circuit according to an embodiment. In this case, the battery monitoring control circuit corresponds to battery management ICs BM1 and BM2 of FIG. 1.

Referring to FIG. 1, a plurality of battery cells B1, B2, . . . are connected in series to configure an assembled battery BA. In this case, each of the plurality of battery cells B1, B2, . . . configures an electricity storage cell by connecting in series a plurality of secondary batteries such as lithium-ion batteries to each other.

The battery management IC BM1 is a battery monitoring control circuit that monitors and controls a voltage of the battery cell B1 or a voltage of each of the secondary batteries of the battery cell B1, and is mounted on a printed circuit board of a cell management unit (CMU) SM1. The cell management unit (CMU) SM1 is configured to include the battery management IC BM1 and two isolation transformers TR1 and TR2 for daisy-chain communications. In addition, the battery management IC BM2 is a battery monitoring control circuit that monitors and controls a voltage of the battery cell B2 or a voltage of each of the secondary batteries of the battery cell B2, and is mounted on a printed circuit board of a cell management unit (CMU) SM2. The cell management unit (CMU) SM2 is configured to include a battery management IC BM2 and two isolation transformers TR1 and TR2 for the daisy-chain communications. Hereinafter, similarly, a battery management IC BMn (n=3, 4, 5, . . . ) (not shown) is provided to monitor and control voltages of a battery cell B3 (not shown) and thereafter.

The battery management unit (BMU) 50 is configured to include a first control circuit 51 that is a control electric control unit (ECU) for controlling the entire battery control system, and an isolation transformer TR0 for the daisy-chain communications. In this case, the isolation transformer TR0 is provided in a galvanic isolation barrier 52 that maintains galvanic isolation at a boundary separation barrier between a low-voltage area AL operating at a low voltage of around 5 V and a high-voltage area AH operating at a high voltage of around 86.4 V.

The BMU 50 is connected to a daisy-chain communication interface (daisy communication I/F) 14 of the battery management IC BM1 via the isolation transformer TR0, a daisy-chain communication line L0, and the isolation transformer TR1 of a cell management unit CM1. In addition, the daisy-chain communication interface 14 of the battery management IC BM1 is connected to the daisy-chain communication interface 14 of a battery management IC BM2 via the isolation transformer TR2 of a cell management unit CM1, the daisy-chain communication line L1, and the isolation transformer TR1 of the cell management unit CM2. Further, the daisy-chain communication interface 14 of the battery management IC BM2 is connected to the daisy-chain communication interface 14 of a battery management IC BM3 via the isolation transformer TR2, a daisy-chain communication line L2, and the like in the cell management unit CM2. Hereinafter, in a manner similar to that of above, the daisy-chain communication interface 14 of each of the battery management ICs BMn (n=3, 4, 5, . . . ) is sequentially connected by daisy chain connection via the daisy-chain communication line.

In the daisy-chain communication system configured above, the first control circuit 51 is connected to the daisy-chain communication interface 14 of the battery management IC BM1, the daisy-chain communication interface 14 is connected to the daisy-chain communication interface 14 of the battery management IC BM2 at the next stage, and the daisy-chain communication interface 14 is connected to the daisy-chain communication interface 14 of the battery management IC BM3 at the next stage. As a result, the first control circuit 51 and the daisy-chain communication interface of each of the battery management ICs BMn (n=1, 2, 3, . . . ) can perform the daisy-chain communications.

For example, the first control circuit 51 transmits a start-up signal for starting the operation of each of the battery management ICs BMn (n=1, 2, 3, . . . ) to the daisy-chain communication interface 14 of the battery management IC BM1. Then, the daisy-chain communication interface 14 transmits the start-up signal to the daisy-chain communication interface 14 of the battery management IC BM2 at the next-stage. The daisy-chain communication interface 14 further transmits start-up signal to the daisy-chain communication interface 14 of the battery management IC BM3 at the next stage, and the same applies hereinafter.

In the embodiment, a daisy-chain communication system is used as a communication system between the first control circuit 51 and each of the battery management ICs BMn (n=1, 2, 3, . . . ), but the present disclosure is not limited thereto, and the other communication systems may be used.

Next, the detailed configuration of each of the battery management ICs BMn (n=1, 2, 3, . . . ) will be described below. In this case, since each of the battery management ICs BMn (n=1, 2, 3, . . . ) has the same configuration, the battery management IC BM1 will be described below as an example.

The battery management IC BM1 is configured to include a second control circuit 10, a power source circuit 11, a multiplexer (MUX) 12, an AD converter (ADC) 13, the daisy-chain communication interface 14, a start-up switch 15, a power converter 20, and a start-up circuit 30. The power source voltage of the battery cell B1 is inputted to the power source circuit 11 via the start-up switch 15, and the power source circuit 11 converts the input power source voltage into a predetermined operating voltage and supplies the operating voltage to the second control circuit 10, the multiplexer 12, the AD converter 13, and the daisy-chain communication interface 14. The multiplexer 12 is connected to both ends of a plurality of batteries of the battery cell B1, detects and selects a both-end voltage, and outputs the both-end voltage to the second control circuit 10 via the AD converter 13. The second control circuit 10 is a control circuit that controls the entire operation of the battery management IC BM1, and sequentially and selectively detects, for example, both-end voltages of the plurality of batteries of the battery cell B1 by controlling the multiplexer 12. Then, the second control circuit 10 outputs the detected voltage to the daisy-chain communication interface 14 to transmit the voltage to, for example, the first control circuit 51.

The starting operation of the battery control system configured as described above will be described below.

When starting each of the battery management ICs BM1, BM2, BM3, . . . , the first control circuit 51 transmits a predetermined start-up signal, which is, for example, a differential AC pulse signal whose amplitude changes with the lapse of time, to the power converter 20 and the daisy-chain communication interface 14 of the battery management IC BM1 via the daisy-chain communication line L0. The power converter 20 applies, for example, full-wave rectification to the input start-up signal to perform AC-DC conversion, and generates a predetermined DC voltage. Then, the power converter 20 converts the DC voltage into a predetermined DC voltage higher than the DC voltage, and applies the converted DC voltage to the start-up circuit 30 as a control signal. In response to this, the start-up circuit 30 turns on. In this case, the start-up circuit 30 outputs a start-up control signal Sc to the control terminal of the start-up switch 15 to turn on the start-up switch 15. As a result, the power source voltage of the battery cell B1 is inputted to the power source circuit 11 via the start-up switch 15, and the power source circuit 11 supplies the electric power as described above. As a result, the battery management IC BM1 is activated or started from the sleep state, which is the standby state. Then, the daisy-chain communication interface 14 started by receiving the power source voltage from the power source circuit 11 transmits a predetermined start-up signal, which is, for example, a differential AC pulse signal whose amplitude changes with the lapse of time, to the power converter 20 and the daisy-chain communication interface 14 of the battery management IC BM2 via the daisy-chain communication line L1. The start-up switch 15 of the battery management IC BM2 turns on by the starting operations of the power converter 20 and the start-up circuit 30 of the battery management IC BM2, and similarly, the battery management IC BM2 is activated from the sleep state, which is the standby state. Similarly, the circuits of the battery management IC BM3 and thereafter will start sequentially.

Therefore, in the embodiment, the battery management IC BM1 that is one of the plurality of battery monitoring control circuits starts by the start-up signal. Then, the battery management IC BM1 transmits the start-up signal from its daisy-chain communication interface 14 to the daisy-chain communication interface 14 of the battery management IC BM2, which is another battery monitoring control circuit, via the daisy-chain communication line L1. Then, this results in starting the second control circuit 10 of the battery management IC BM2, which is another battery monitoring control circuit. Next, the battery management IC BM2 transmits the start-up signal from its daisy-chain communication interface 14 to the daisy-chain communication interface 14 of the battery management IC BM3, which is still another battery monitoring control circuit, via the daisy-chain communication line L2. Then, this results in starting the second control circuit 10 of the battery management IC BM3, which is still another battery monitoring control circuit. The same applies to the subsequent circuits.

Figure 6:
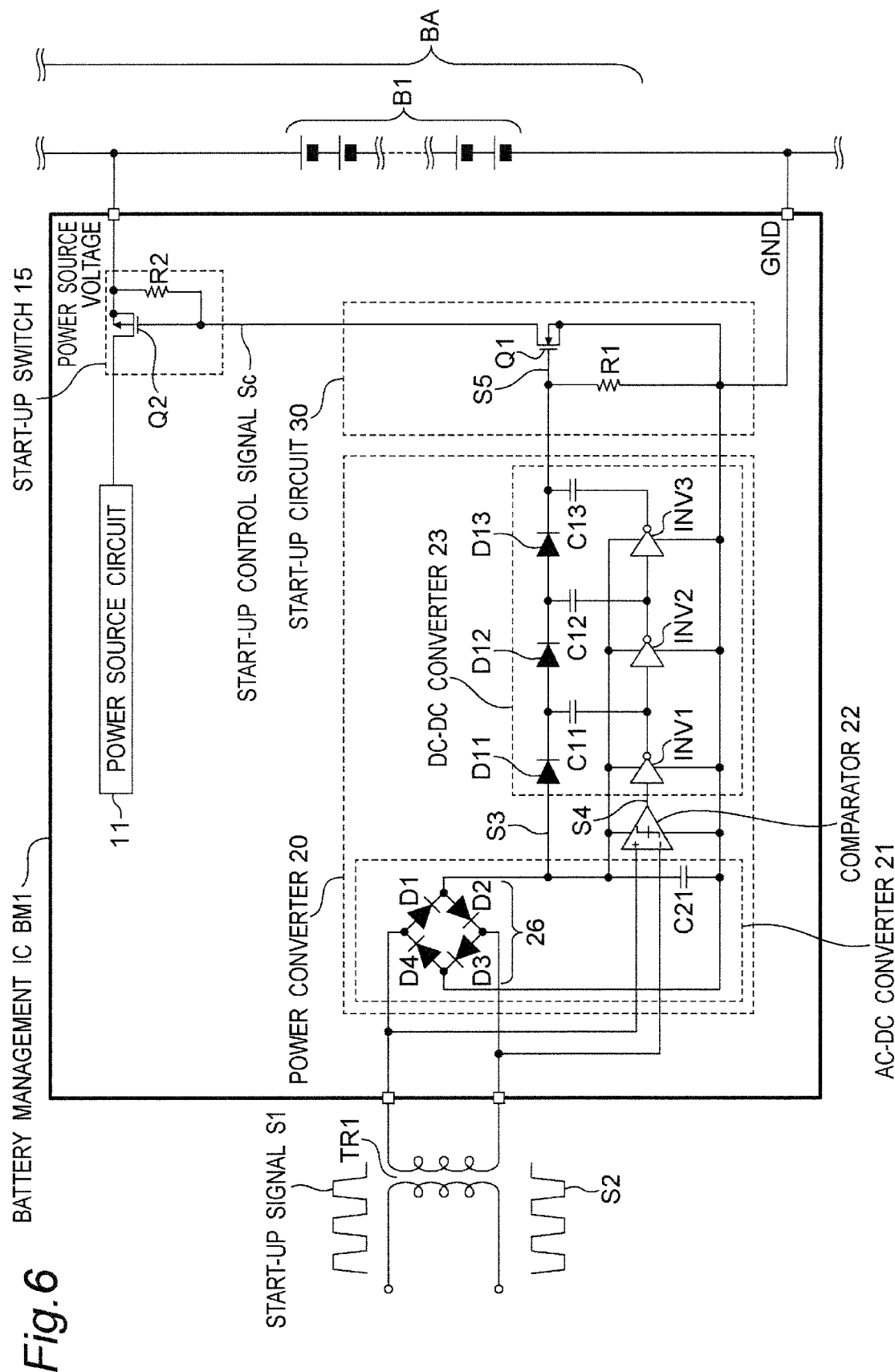
FIG. 6 is a circuit diagram illustrating an example of a detailed configuration of a power converter, a start-up circuit, and a start-up switch of a battery management IC BM1 of FIG. 1.

FIG. 6 is a circuit diagram illustrating an example of a detailed configuration of the power converter 20, the start-up circuit 30, and the start-up switch 15 of the battery management IC BM1 of FIG. 1.

Referring to FIG. 6, the power converter 20 is configured to include an AC-DC converter 21, a comparator 22, and a DC-DC converter 23. In this case, the AC-DC converter 21 includes, for example, a diode bridge full-wave rectifier circuit 26 including four diodes D1 to D4, and a smoothing capacitor C21. The power converter 20 performs full-wave rectification of input differential start-up signals S1 and S2, which are, for example, differential pulse signals, and then smooths to convert these signals into a predetermined DC voltage signal S3. Then, the power converter 20 supplies the signal as the power source voltage to the comparator 22 and the DC-DC converter 23. Based on the input differential start-up signals S1 and S2, the comparator 22 generates a binary clock signal S4 of a predetermined cycle using its own hysteresis characteristics having respective threshold values on the positive electrode side and the negative electrode side, and supplies the binary clock signal S4 to the DC-DC converter 23. In other words, the comparator 22 configures a signal generator that generates the binary clock signal S4.

The DC-DC converter 23 is configured to include three diodes D11 to D13, capacitors C11 to C13, and three inverters INV1 to INV3 to configure a so-called known charge-pump circuit. The DC-DC converter 23 sequentially steps up the input DC voltage signal S3 in synchronization with the clock signal S4 while charging and discharging charges to and from the capacitors C11 to C13 according to the clock signal. As a result, the DC-DC converter 23 converts the input DC voltage signal S3 into the DC voltage higher than the input DC voltage, and outputs the converted DC voltage to the start-up circuit 30. The start-up circuit 30 includes, for example, an N-channel MOS transistor Q1 of a switching element, and a resistor R1 connected between a gate of the N-channel MOS transistor Q1 and the ground. The start-up circuit 30 turn on at the time of starting, generates the start-up control signal Sc of a predetermined L-level, and outputs the start-up control signal Sc to the start-up switch 15. The start-up switch 15 includes, for example, a P-channel MOS transistor Q2 of a switching element, and a resistor R2 connected between a gate and a source of the P-channel MOS transistor Q2. The start-up switch 15 turns on in response to the start-up control signal Sc of the L-level, and supplies the power source voltage of the battery cell B1 to the power source circuit 11.

It is noted that the battery management ICs BM2, BM3, . . . are configured and operated in a manner similar to that of the battery management IC BM1 except that the start-up signal comes from the battery management IC at the previous stage.

Figure 7:
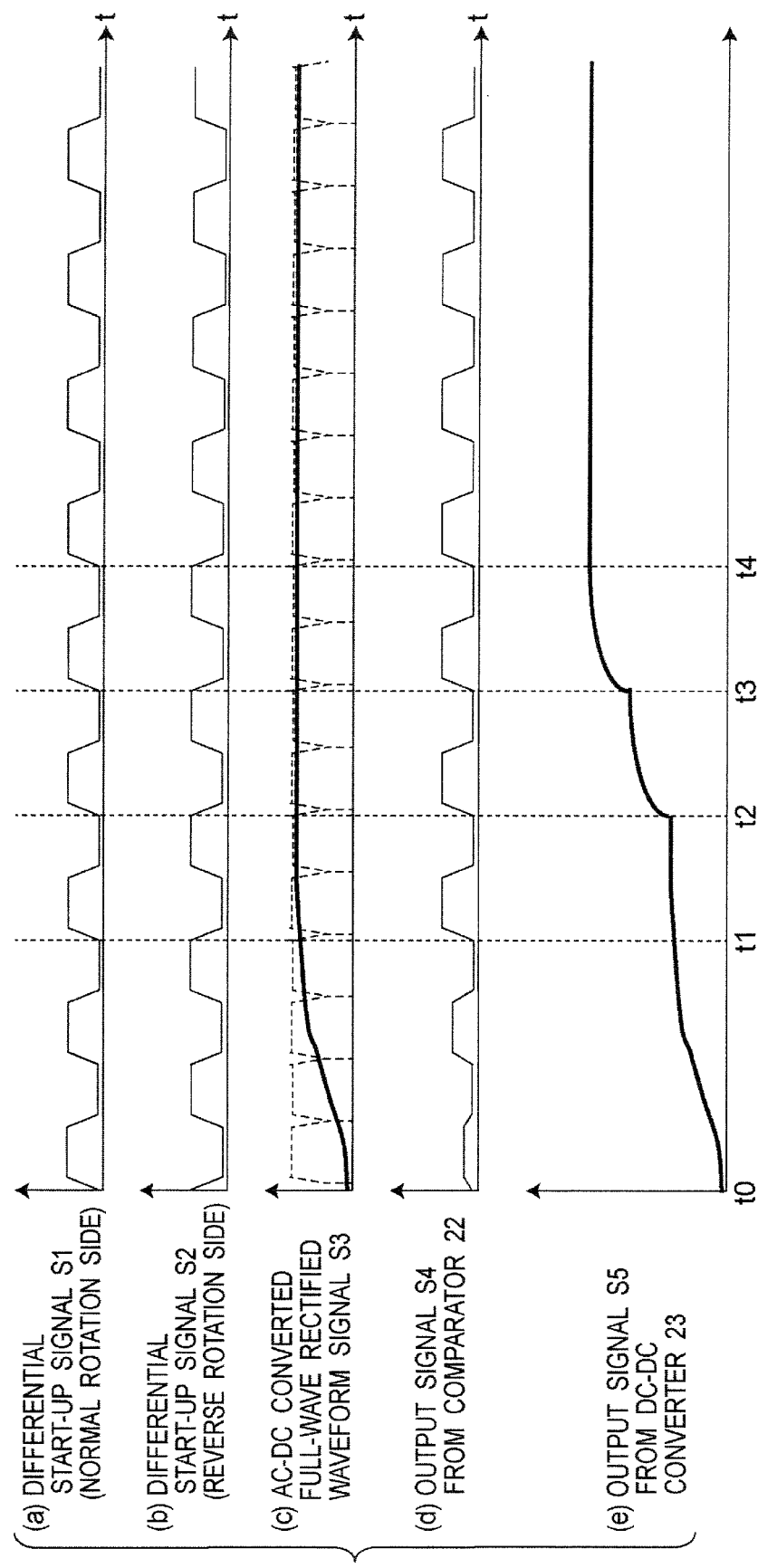
FIG. 7 is a timing chart illustrating an operation of the battery management IC BM1 of FIG. 6.

FIG. 7 is a timing chart illustrating an operation of the battery management IC BM1 of FIG. 6. As is apparent from FIG. 7, in the circuit of FIG. 6 configured as described above, the AC-DC converter 21 performs full-wave rectification on the differential start-up signals S1 and S2 having an inversion relationship with each other. The full-wave rectified waveform signal S3 is inputted to the DC-DC converter 23. The comparator 22 generates the clock signal S4 with a predetermined cycle from the input differential start-up signals S1 and S2, and then, supplies the clock signal S4 to the DC-DC converter 23. The DC-DC converter 23 is driven by the clock signal S4 to sequentially step up the input full-wave rectified waveform signal S3 and to convert the full-wave rectified waveform signal S3 into the DC voltage higher than the input DC voltage. Then the DC-DC converter 23 outputs the converted DC voltage to the start-up circuit 30. The start-up circuit 30 turns on at the time of starting with a predetermined threshold voltage or above, generates the start-up control signal Sc of the predetermined L-level, and outputs the start-up control signal Sc to the start-up switch 15. The start-up switch 15 turns on in response to the start-up control signal Sc of the L-level, and supplies the power source voltage of the battery cell B1 to the power source circuit 11. As a result, the battery management IC BM1, which is the battery monitoring control circuit, is activated from the sleep mode, which is the standby state (the sleep state before starting the battery monitoring control circuit).

As is apparent from FIGS. 6 and 7, the differential signal is used as the start-up signals S1 and S2 due to the following reason. For example, even when the amplitudes of the differential signals S1 and S2 change due to fluctuation of the power source voltage or superimposition of noise in the battery management unit 50, the fluctuation is absorbed by the comparator 22 at least when the differential signals S1 and S2 fluctuate simultaneously, so as to prevent malfunction from occurring with respect to the timing of generating the start-up control signal Sc. However, when a single-ended signal is used as the start-up signal, the comparator 22 cannot absorb the above-described fluctuation, and there is a possibility that a malfunction occurs with respect to the timing of generating the start-up control signal Sc.

In addition, referring to FIG. 6, the clock signal S4 obtained by binarizing the start-up signals S1 and S2 by the comparator 22 can be supplied to the DC-DC converter 23. In addition, in the DC-DC converter 23, which is the charge-pump circuit, the boosting operation does not complete unless clocks for the number of stages of the charge-pump are inputted. In other words, since the DC-DC converter 23 acts as a kind of filter against noise that is not the start-up signals S1 and S2, it is possible to distinguish between the normal start-up signal and noise to prevent malfunction.

It is noted that the differential start-up signals S1 and S2 are used in the embodiment, but the present disclosure is not limited thereto. A repetitive signal of a predetermined cycle having at least a changing amplitude can be used, and the repetitive signal may be, for example, an AC signal such as a sine wave signal or a rectangular wave signal.

As described above, the battery monitoring control circuit of the embodiment can provide the battery control system (BMS) that controls, for example, the assembled battery BA in which the battery cells B1, B2, . . . are connected in series. In each of the battery cells, the secondary batteries such as the plurality of lithium-ion batteries are connected in series. The battery monitoring control circuit can monitor and control a state of charge (SOC) by measuring a voltage of each of the secondary batteries of the battery cells B1, B2, . . . of the assembled battery BA. In this case, the battery monitoring control circuit further includes the start-up circuit 30 that starts the second control circuit 10, which is, for example, a cell management unit (CMU), from the sleep state, which is the standby state, and the power converter 20 that starts and controls the start-up circuit 30 by the start-up signals S1 and S2. In this case, the battery monitoring control circuit has a simple system configuration to start by transmitting the start-up signals S1 and S2 from the first control circuit 51 of the battery management unit 50 via the communication interface. Accordingly, the electric power consumption of the battery monitoring control circuit in the sleep mode can be reduced to zero.

Modified Embodiments

Figure 2:
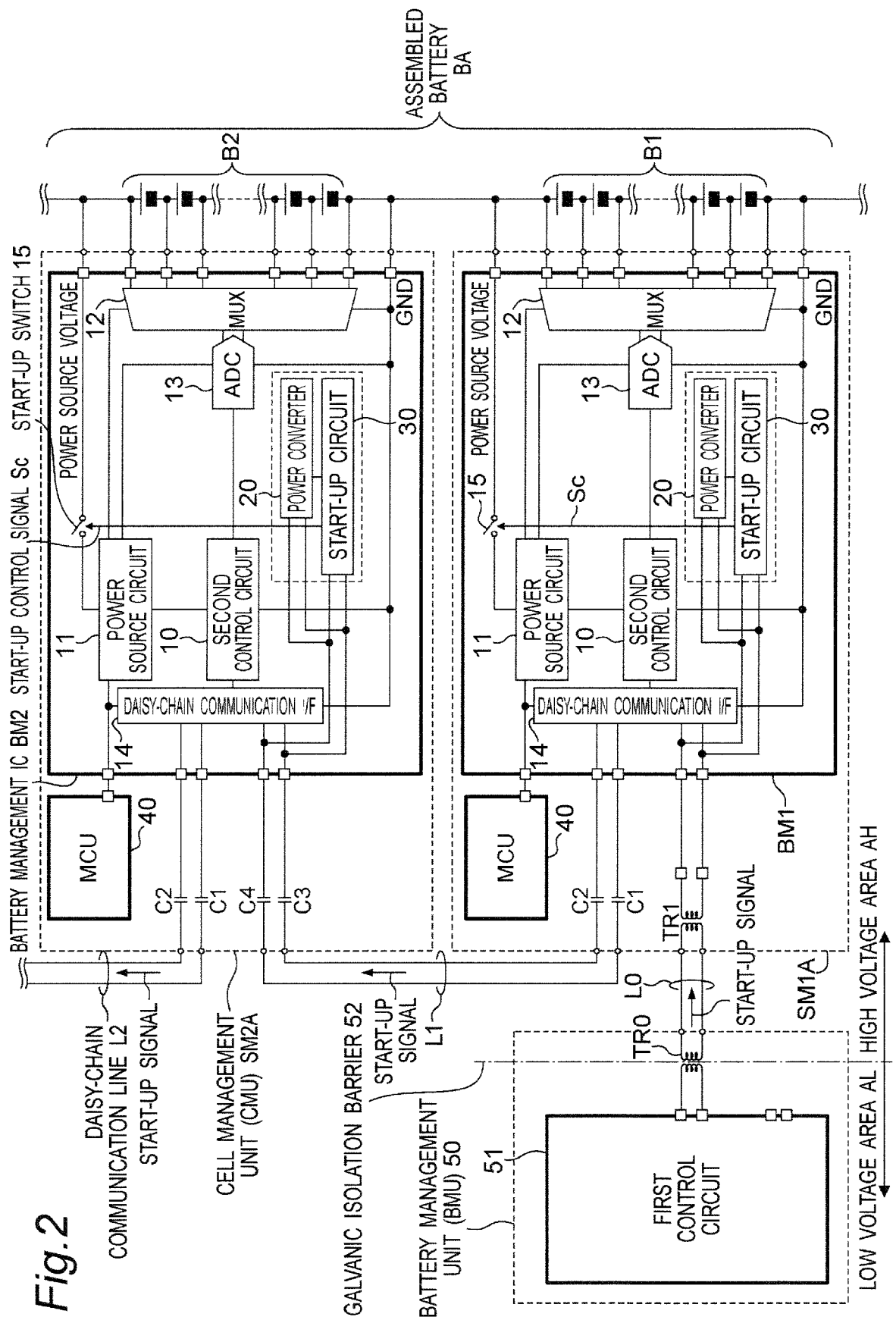
FIG. 2 is a block diagram illustrating an example of a configuration of a battery control system including a battery monitoring control circuit according to a modified embodiment of the embodiment.

FIG. 2 is a block diagram illustrating an example of a configuration of a battery control system including a battery monitoring control circuit according to a modified embodiment. Referring to FIG. 2, the battery monitoring control circuit according to the modified embodiment is different from the battery monitoring control circuit of FIG. 1 in the following points:

(1) instead of the cell management units SM1 and SM2, cell management units SM1A and SM2A are provided;

(2) the cell management unit SM1A includes two capacitors C1 and C2, instead of the isolation transformer TR2 of FIG. 1, connected to the daisy-chain communication line L1; and (3) the cell management unit SM2A includes four capacitors C1, C2, C3, and C4, instead of the isolation transformers TR1 and TR2 of FIG. 1, connected to the daisy-chain communication line L1.

These capacitors C1 to C4 operate as coupling capacitors that do not pass the DC voltage but pass the start-up signal of an AC signal.

The modified embodiment configured as described above operates in a manner similar to that of the battery monitoring control circuit of FIG. 1, and has similar function and effects. In other words, referring to FIG. 2, the electric power is supplied from the power source circuit 11 of the battery monitoring control circuit similar to that of FIG. 1 to the second control circuit 10, which is the cell management unit (CMU). As a result, in a manner similar to that of the above, the battery monitoring control circuit can start based on the start-up control signal Sc, and the second control circuit 10 can start from the battery monitoring control circuit.

Comparative Examples 1 and 2

Now, in order to facilitate understanding of the present disclosure, the comparative examples 1 and 2 that are general circuits and systems will be described.

Figure 3:
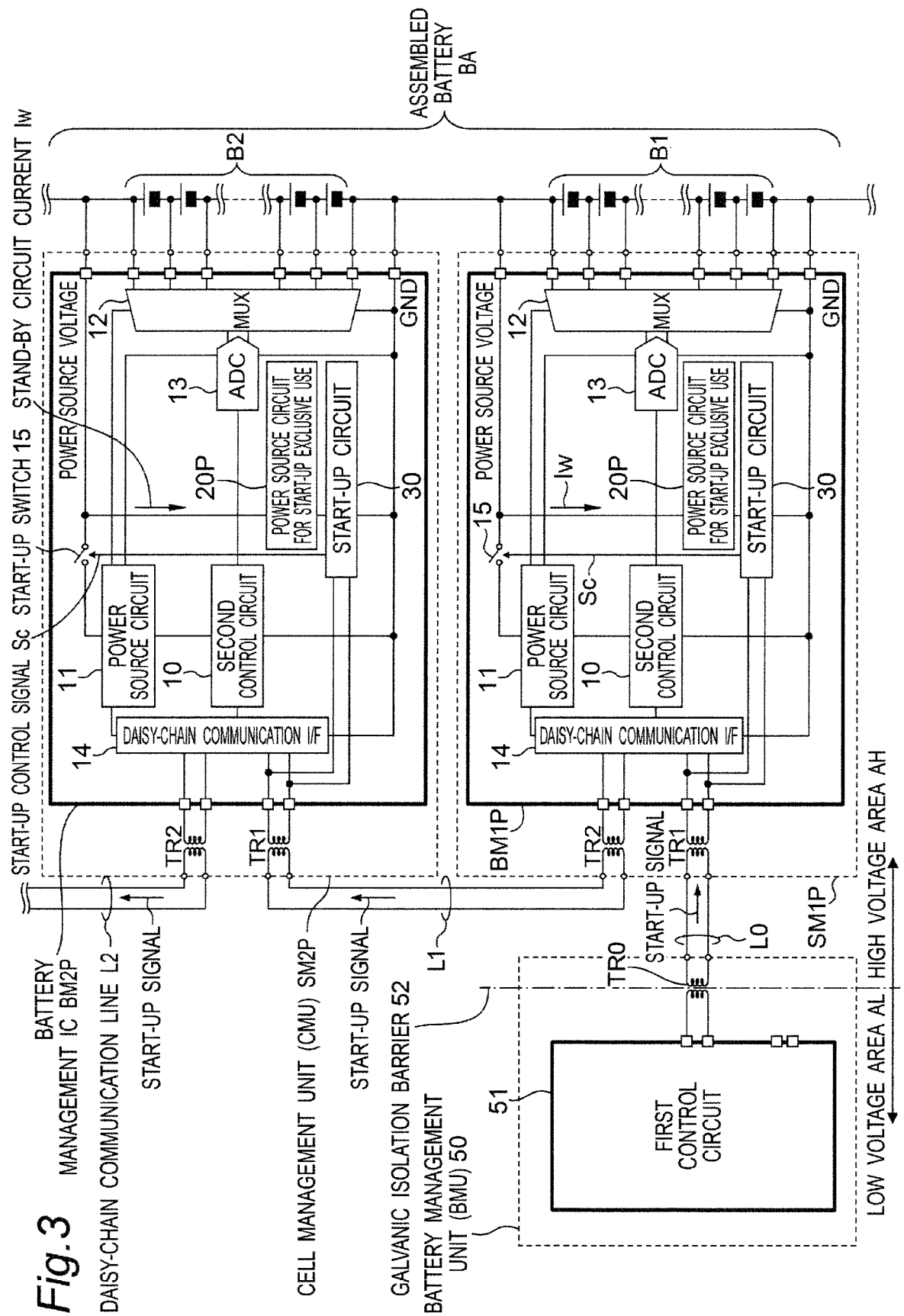
FIG. 3 is a block diagram illustrating an example of a configuration of a battery control system including a battery monitoring control circuit according to a comparative example 1.
Figure 4:
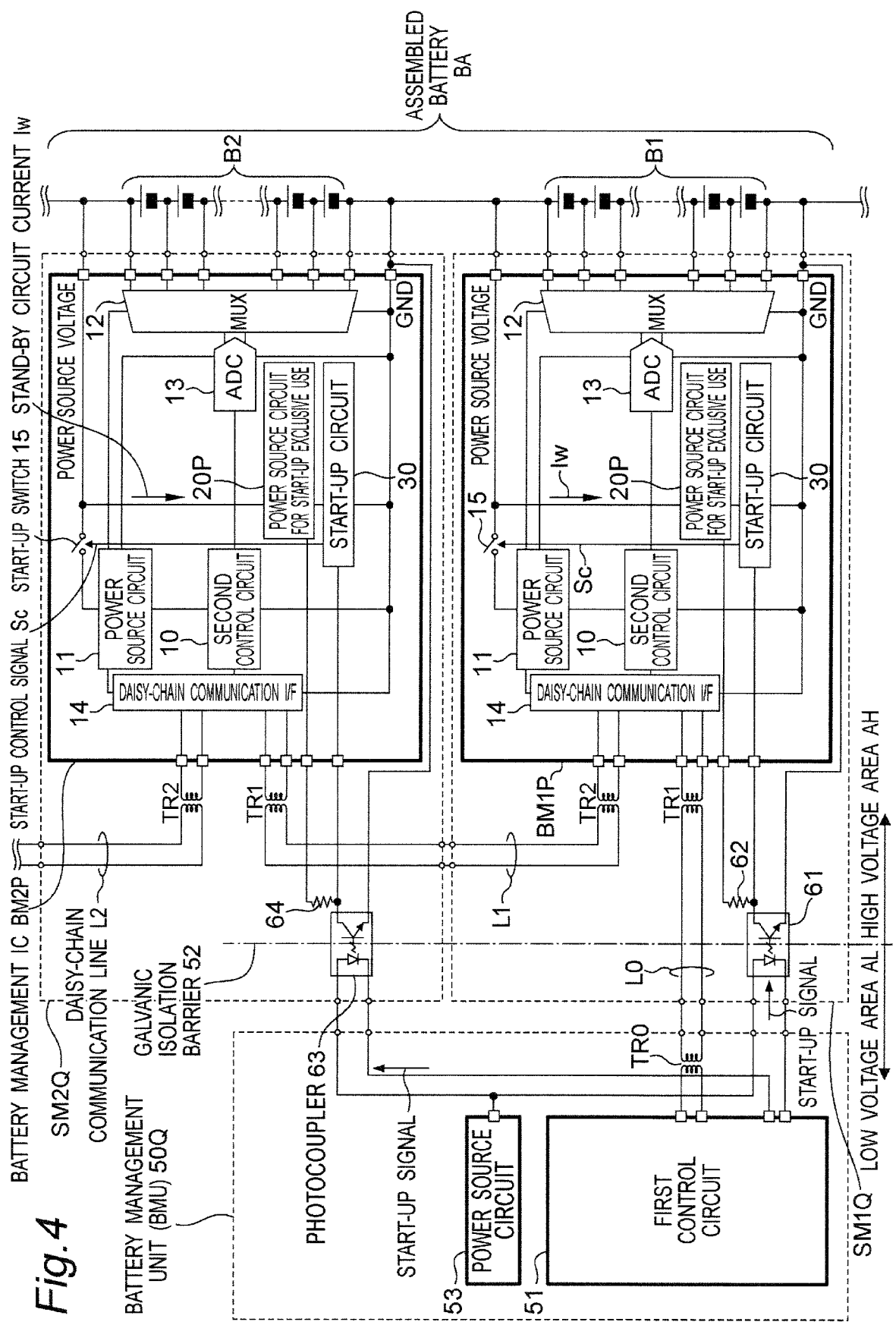
FIG. 4 is a block diagram illustrating an example of a configuration of a battery control system including a battery monitoring control circuit according to a comparative example 2.

FIG. 3 is a block diagram illustrating an example of a configuration of a battery control system including a battery monitoring control circuit according to the comparative example 1, and FIG. 4 is a block diagram illustrating an example of configuration of a battery control system including a battery monitoring control circuit according to the comparative example 2.

A lithium-ion battery is used as a storage battery that can store a large amount of electric power. However, since the lithium-ion battery has a risk of deterioration due to over-discharge, or heat generation and explosion due to over-charge, it is important to accurately grasp the SOC and use the voltage of each of the battery cells within a certain voltage range. In particular, an on-vehicle lithium-ion battery of an automobile such as an electric vehicle (EV) or a hybrid vehicle (HEV) generates a voltage of about 400 to 800 V by an assembled battery in which several hundreds of cells (batteries) are connected in series to drive a motor. In order to control such a lithium-ion assembled battery, the assembled battery is generally divided into a plurality of blocks having about 6 to 24 cells in series connections, and the battery monitoring control circuit monitors and controls each of the cells in each of the blocks.

In addition, in the battery monitoring control circuit of the assembled battery, a negative electrode of the lowermost cell is connected to a GND (ground) terminals, and a positive electrode of the uppermost cell is connected to the power source voltage terminal with respect to the potential difference generated by the battery cells connected in series in divided blocks. In this case, the output voltage of a general lithium-ion battery cell is about 3.6 V. For example, in a battery monitoring control circuit that manages a block of 24 cells in series, a voltage of about 86.4 V is applied between the power source and GND terminals.

In order to individually measure the voltages of battery cells connected in series, the battery monitoring control circuit includes a multiplexer (MUX) that selects a cell to be measured, an AD converter that measures a voltage of the selected cell, a control logic, and the like. The battery monitoring control circuit further includes a communication interface with a control circuit (control electric control unit (ECU)) of an upper battery control system (BMS) for a measured voltage value of each of the battery cells.

In general, in order to satisfy required specifications such as circuit performance, a chip area, and current consumption, the AD converter, the control logic, and the communication interface built in the battery monitoring control circuit is configured with transistor devices each having a low operating power source voltage of about 1.8 to 5 V. Therefore, the battery monitoring control circuit includes a power source circuit for the built-in circuit from a high power source voltage between the power source and the GND terminals. For example, in the case of a battery monitoring control circuit that manages 24 cells in series, a regulator that generates a power source voltage of about 1.8 V or about 5 V from about 86.4 V is provided to supply the electric power to the built-in circuit.

The assembled battery of driving lithium-ion battery that generates a high voltage of about 400 to 800 V is mounted on an electric vehicle (EV), a hybrid vehicle (HEV) or the like, and is installed in a high-voltage power source system subjected to galvanic isolation from a low-voltage power source system supplied by an auxiliary battery (for example, a lead battery and a 12 V lead battery) mainly used for controlling a vehicle (for example, starting the engine, supplying electricity to electrical components, and the like). Therefore, since the battery monitoring control circuit that controls the driving lithium-ion battery needs to be directly connected to the lithium-ion battery, the battery monitoring control circuit is installed in the high-voltage power source system. On the other hand, the control circuit that controls the lithium-ion battery is often installed on the side of the auxiliary battery (lead battery or 12 V lead battery).

Therefore, as illustrated in FIGS. 3 and 4, the communication interface between the general battery monitoring control circuit and the control circuit is connected using isolation transformers TR1 and TR2, photocouplers 61 and 63, or the like in order to perform communications while maintaining galvanic isolation. The resistors 62 and 64 are circuit resistors for supplying the electric power to the photocouplers 61 and 63. In addition, the battery management ICs BM1P and BM2P or BM1Q and BM2Q of the cell management units SM1P and SM2P or SM1Q and SM2Q of FIGS. 3 and 4 include a power source circuit 20P for start-up exclusive use (not the power converter 20 of FIG. 1), through which a standby circuit current Iw flows from the power source voltage of the battery cells B1 and B2.

Meanwhile, since the plurality of battery monitoring control circuits connected to the assembled battery is installed at voltage potentials having different GND levels, it is necessary to perform the communications between voltage potentials having different GND levels in the communications between the battery monitoring control circuits. Therefore, an on-vehicle battery monitoring control circuit of an electric vehicle (EV), a hybrid vehicle (HEV), or the like is provided with a daisy-chain communication interface. The communication interface performs the communications in a galvanically insulated state between the battery monitoring control circuit and the control circuit, and the communications between voltage potentials having different GND levels between the battery monitoring control circuits.

Since such an on-vehicle battery monitoring control circuit is used as a lithium-ion battery module in a state of being connected to the assembled battery, the battery monitoring control circuit is used without being electrically disconnected from the assembled battery. Therefore, the on-vehicle battery monitoring control circuit assembled once as a module and connected to the assembled battery continues to operate without its power source being interrupted. Therefore, when a vehicle is parked for a long time or a vehicle or a battery module is transported or stored, the electric power stored from the lithium-ion battery is gradually discharged from the connected battery monitoring control circuit. This may cause an over-discharge state in the lithium-ion battery or disruption of a so-called cell balance that is homogenization of the electricity storage amount in battery cells of the assembled battery.

Therefore, the on-vehicle battery monitoring control circuit is provided with an operation mode called a sleep mode, a stationary mode, or the like in which the electric power consumption is minimized. It is necessary to minimize the electric power consumption in the on-vehicle battery monitoring control circuit to minimize the amount of discharge from the battery when a vehicle is parked for a long time or the battery module is transported or stored as described above. However, in the general battery monitoring control circuit illustrated in FIG. 3 or 4, the battery monitoring control circuit is activated from the sleep mode to the normal operation state by the start-up signal from the first control circuit 51. Therefore, in order to receive the start-up signal, it is necessary to continue to flow the circuit current Iw for operating the minimum necessary circuit of the battery monitoring control circuit.

Next, a method of starting a general battery control system from the sleep mode to a normal operation state will be described with reference to FIGS. 3 and 4.

FIG. 3 illustrates the method in which the first control circuit 51 transmits the start-up signal from the communication interface to the battery monitoring control circuit to start the normal operation state from the sleep mode. In the battery monitoring control circuit of FIG. 3, it is necessary to keep a receiver circuit (start-up circuit 30 of FIG. 3) of the communication interface of the operation state even in the sleep mode. Therefore, the power source circuit 20P for start-up exclusive use that supplies the electric power to the start-up circuit 30 of the battery monitoring control circuit also needs to continue to operate. In this case, a start-exclusive receiver circuit (the start-up circuit 30 of FIG. 3) and the power source circuit 20P for start-up exclusive use are provided separately from the normal communication interface circuit to design the circuit with the electric power consumption as low as possible in the sleep mode.

However, since the operating current Iw of the circuit continues to flow in the start-up circuit 30 and the power source circuit 20P for start-up exclusive use, there is such a problem that the electric power consumption in the sleep mode cannot be reduced to zero.

In addition, FIG. 4 illustrates a method in which the first control circuit 51 transmits the start-up signal by the photocoupler 61 installed separately from the communication interface to start the normal operation state of the battery monitoring control circuit from the sleep mode. The reason for using the photocouplers 61 and 63 is that the first control circuit 51 and the battery monitoring control circuit need to maintain galvanic isolation while the start-up signal is transmitted beyond the galvanic isolation barrier 52. Even in the case of starting using the photocouplers 61 and 63 of FIG. 4, how to supply the electric power to a phototransistor on the light receiving side of the photocouplers 61 and 63 becomes a problem. It is necessary to provide a power source circuit 53 of a battery management unit 50Q.

Further, when an emitter-collector withstand voltage of the phototransistor on the light receiving side of the photocouplers 61 and 63 is about 80 to 300 V, and the power source connected to a power supply unit of, for example, about 86.4 V from the uppermost battery cell managed by the battery monitoring control circuit is used, this leads to such a new problem that a dark current of such photocouplers 61 and 63 increases acceleratively at high temperatures. In addition, in the general photocouplers 61 and 63, in such a state that a high voltage is applied between the emitter and the collector on the light receiving side, the dark current becomes several microamperes or more at an operating temperature of around 80° C.

Therefore, in the case of using the photocouplers 61 and 63 and the power source circuit 53 that generates a voltage of around 5 V as illustrated in FIG. 4, the input circuit and the control circuit of the battery monitoring control circuit that inputs the output signal from the photocouplers 61 and 63 also require a power source of 5 V or less. Therefore, the battery monitoring control circuit is provided with the power source circuit 20P for start-up exclusive use that outputs a voltage of about 5 V to the battery monitoring control circuit, and the electric power is supplied to the photocouplers 61 and 63 and the start-up circuit 30. Thus, this leads to such a problem that the electric power consumption in the sleep mode cannot be reduced to zero even in FIG. 4.

Comparative Example 3

Figure 5:
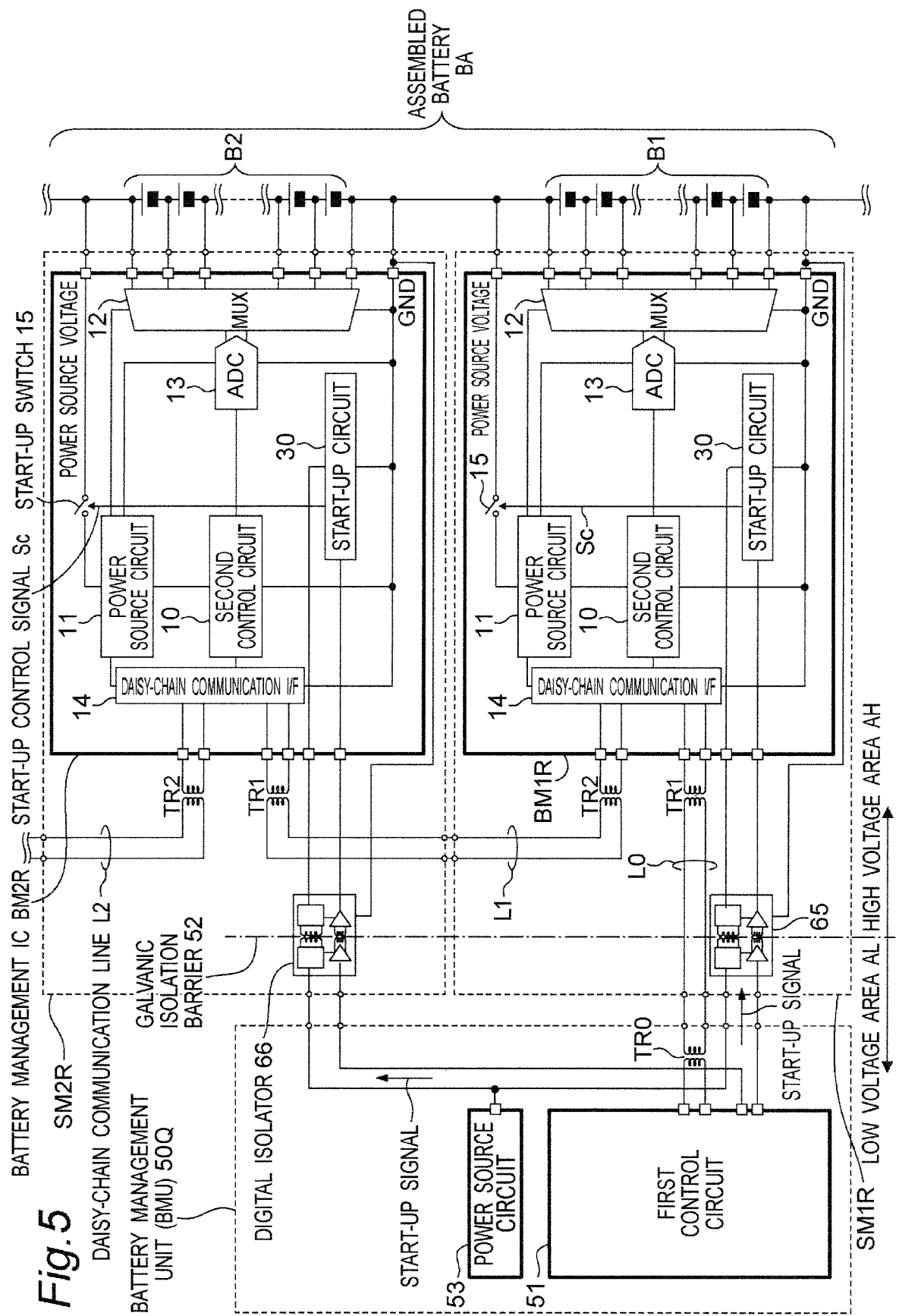
FIG. 5 is a block diagram illustrating an example of a configuration of a battery control system including a battery monitoring control circuit according to a comparative example 3.

Further, FIG. 5 illustrates a general example in which the electric power consumption of the battery monitoring control circuit in the sleep mode is reduced to zero.

FIG. 5 is a block diagram illustrating an example of a configuration of a battery control system including a battery monitoring control circuit according to the comparative example 3. The battery control system of FIG. 5 includes digital isolators 65 and 66 instead of the photocouplers 61 and 63 in the comparative example 2.

Referring to FIG. 5, the battery control system is equipped with the digital isolators 65 and 66 that are insulated DC-DC power source circuits for supplying a power source voltage to start the battery monitoring control circuit from the power source circuit 53 on the first control circuit 51 side beyond the galvanic isolation barrier 52. Since the digital isolators 65 and 66 of the insulated DC-DC power source circuits supply the electric power to the start-up circuit 30, it is possible to reduce the electric power consumption in the battery monitoring control circuit to zero.

However, since it is necessary to dispose the digital isolator 66, which is an insulated DC-DC power source circuit, on the cell management units SM1R and SM2R on which all the battery monitoring control circuits are mounted, this leads to another problem that an area of a printed circuit board (PCB) and the number of components of the cell management units SM1R and SM2R increase.

On the other hand, the battery monitoring control circuit and the battery control system according to the embodiment solve the above-described problems. The electric power consumption in the battery monitoring control circuit in the sleep mode can be reduced to zero with a simple system configuration without using the digital isolators 65 and 66, which are the insulated DC-DC power source circuits of FIG. 5, and the photocouplers 61 and 63 of FIG. 4. As illustrated in FIG. 3, the battery monitoring control circuit starts by transmitting the start-up signal from the first control circuit 51 by the communication interface.

Modified Embodiment 1

Figure 8:
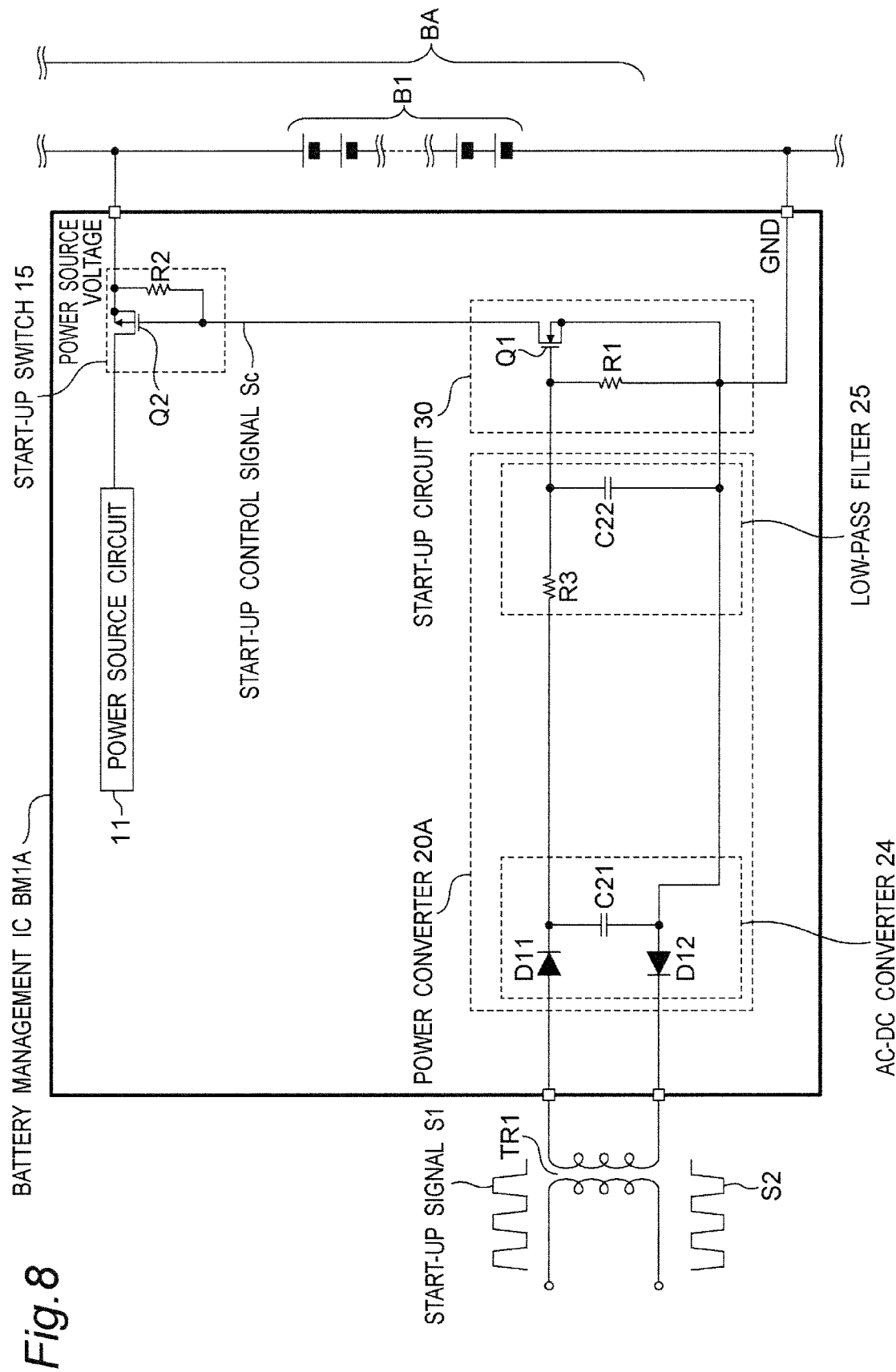
FIG. 8 is a circuit diagram illustrating an example of a detailed configuration of a power converter, a start-up circuit, and a start-up switch of a battery management IC BM1A according to a modified embodiment 1.

FIG. 8 is a circuit diagram illustrating an example of a detailed configuration of a power converter, a start-up circuit, and a start-up switch of a battery management IC BM1A according to a modified embodiment 1. The circuit of FIG. 8 differs from the circuit of FIG. 6 in the following points:

(1) a power converter 20A is provided instead of the power converter 20; and (2) the power converter 20A includes an AC-DC converter 24 and a low-pass filter 25.

Hereinafter, the differences will be described.

Referring to FIG. 8, the AC-DC converter 24 includes diodes D11 and D12 and a capacitor C21 to configure a half-wave rectifier circuit. The AC-DC converter 24 performs half-wave rectification on the input differential start-up signals S1 and S2 to convert the differential start-up signals S1 and S2 into a predetermined DC voltage, and outputs the DC voltage to the start-up circuit 30 via the low-pass filter 25. The low-pass filter 25 includes a resistor R3 and a capacitor C22, reduces ripple and noise in the input DC voltage, and outputs the processed DC voltage to the start-up circuit 30 as a start voltage.

In a manner similar to that of the circuit of FIG. 6, the circuit of FIG. 8 configured as described above can generate the start DC voltage from the differential start-up signals S1 and S2. The circuit configurations and operations of the start-up circuit 30 and the start-up switch 15 are exactly the same as those of FIG. 6.

Modified Embodiment 2

Figure 9:
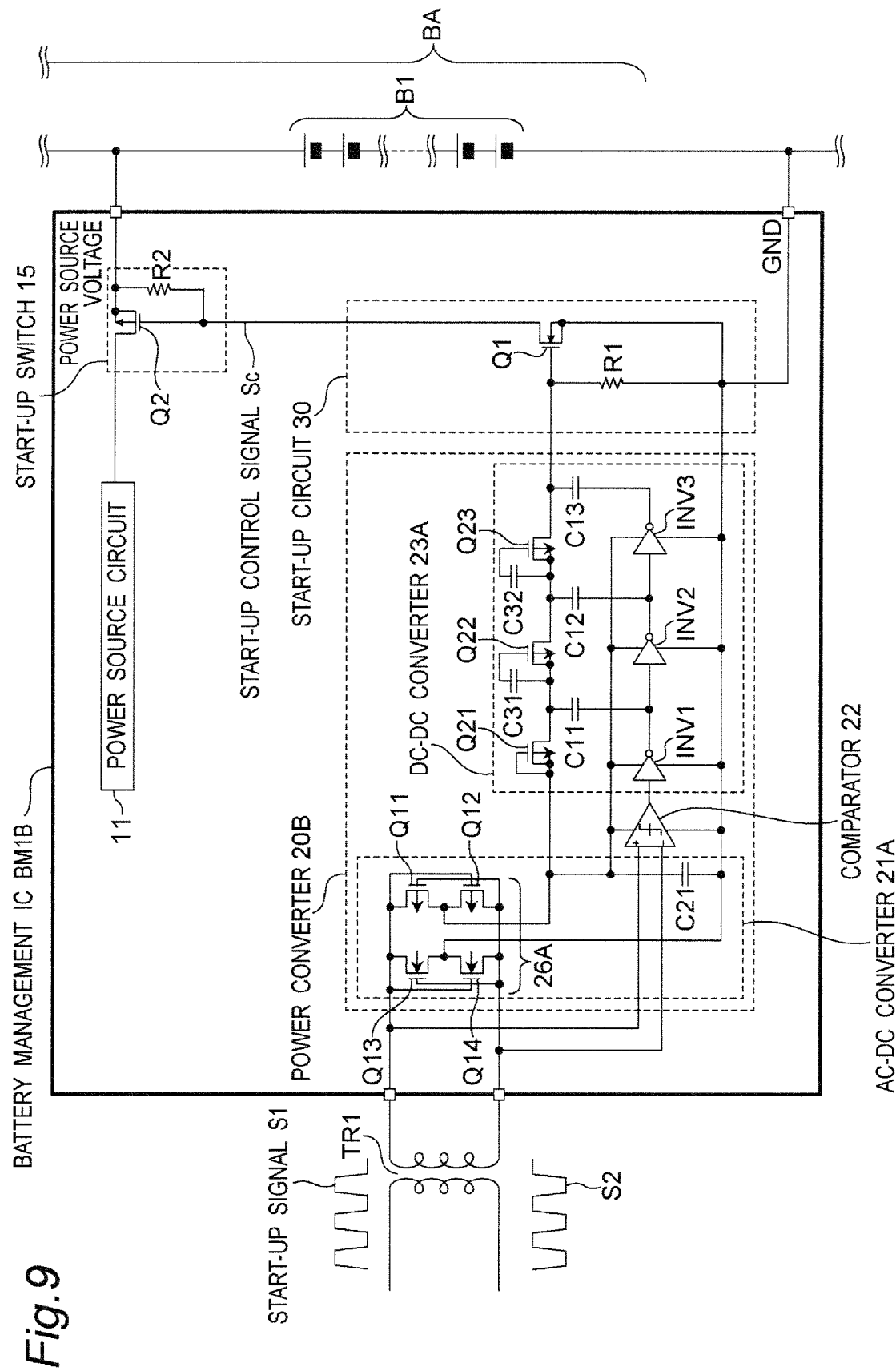
FIG. 9 is a circuit diagram illustrating an example of a detailed configuration a power converter, a start-up circuit, and a start-up switch of a battery management IC BM1B according to a modified embodiment 2.

FIG. 9 is a circuit diagram illustrating an example of a detailed configuration of a power converter, a start-up circuit, and a start-up switch of a battery management IC BM1B according to a modified embodiment 2. The circuit of FIG. 9 differs from the circuit of n FIG. 6 in the following points:

(1) a power converter 20B is provided instead of the power converter 20;

(2) the power converter 20B includes an AC-DC converter 21A, a comparator 22, and a DC-DC converter 23A;

(3) the AC-DC converter 21A includes, for example, a diode-connected bridge full-wave rectifier circuit 26A including four MOS transistors Q11 to Q14, and a smoothing capacitor C21; and (4) the DC-DC converter 23A includes three MOS transistors Q21 to Q23, capacitors C31 and C32, capacitors C11 to C13, and three inverters INV1 to INV3 to configure a so-called known charge-pump circuit.

Hereinafter, the differences will be described.

Referring to FIG. 9, the power converter 20A performs full-wave rectification of input differential start-up signals S1 and S2 which are, for example, differential pulse signals, and then smooths to convert these signals into a predetermined DC voltage signal S3. Then, the power converter 20A supplies the signals as the power source voltage to the comparator 22 and the DC-DC converter 23. The comparator 22 operates in a manner similar to that of FIG. 6, generates a binary clock signal S4 of a predetermined cycle using its own hysteresis characteristics having respective threshold values on the positive electrode side and the negative electrode side based on the input differential start-up signals S1 and S2, and supplies the binary clock signal S4 to the DC-DC converter 23.

In a manner similar to that of the DC-DC converter 23 of FIG. 6, the DC-DC converter 23A sequentially steps up the input DC voltage signal S3 in synchronization with the clock signal S4 while charging and discharging charges to and from the capacitors C11 to C13 according to the clock signal. As a result, the DC-DC converter 23A converts the input DC voltage signal S3 into the DC voltage higher than the input DC voltage, and outputs the converted DC voltage to the start-up circuit 30.

In a manner similar to that of the circuit of FIG. 6, the circuit of FIG. 9 configured as described above can generate the start DC voltage from the differential start-up signals S1 and S2. The circuit configurations and operations of the start-up circuit 30 and the start-up switch 15 are the same as those of FIG. 6.

Other Modified Embodiments

In the above embodiment and modified embodiments, the assembled battery BA includes the plurality of battery cells B1, B2, . . . , but the present disclosure is not limited thereto, and the assembled battery may include a plurality of lithium-ion capacitor cells. In this case, the battery cells B1, B2, . . . and the lithium-ion capacitor cells are collectively referred to as, for example, "electricity storage cells".

As detailed above, according to the present disclosure, the electric power consumption of the battery monitoring control circuit in the sleep mode is reduced to zero with a simple system configuration in which the control circuit starts by transmitting the start-up signal from the communication interface without using an insulated DC-DC power source circuit such as a digital isolator or a photocoupler. As a result, even when a vehicle is parked for a long time or a vehicle or a battery module is transported or stored, the electric power stored from the lithium-ion battery is not gradually discharged from the battery monitoring control circuit thereto. Therefore, it is possible to transport or store the battery module for a long term in a state no deterioration occurs due to over-discharge. Accordingly, the present disclosure is applicable to battery control systems in various applications that use the lithium-ion assembled battery for home use, industrial use, and storage batteries, in addition to the mobility field such as electric vehicles (EVs), hybrid vehicles (HEVs), and electric motorcycles.

What is claimed is:

1. A battery control system comprising:
 a plurality of battery monitoring control circuits configured to measure an output voltage of an individual or a plurality of secondary battery cells, the plurality of secondary battery cells being connected in an assembled battery that is divided into a plurality of blocks; and
 a control circuit configured to control the plurality of battery monitoring control circuits,
 wherein each of the plurality of battery monitoring control circuits comprises:
 a communication interface that performs communications between the plurality of battery monitoring control circuits or communications with the control circuit;
 a power converter that converts a start-up signal inputted to the communication interface into a DC voltage; and
 a start-up circuit that receives the DC voltage from the power converter as a power source voltage, and generates a start-up control signal for starting the battery monitoring control circuit,
 wherein the communication interface is a daisy-chain communication interface that connects the plurality of battery monitoring control circuits in a daisy chain, and
 wherein one of the plurality of battery monitoring control circuits starts another one of the plurality of battery monitoring control circuits based on the start-up signal.

2. The battery control system as claimed in claim 1,
 wherein the one of the plurality of battery monitoring control circuits starts the control circuit in the one of the plurality of battery monitoring control circuits based on the start-up signal.

3. The battery control system as claimed in claim 1,
 wherein the communication interfaces of respective ones of the plurality of battery monitoring control circuits are connected through an isolation transformer or a coupling capacitor connects.

4. The battery control system as claimed in claim 1,
 wherein the start-up signal is a repetitive AC signal having a changing amplitude and a predetermined cycle, and is a differential signal, a sine wave signal, or a rectangular wave signal.

5. The battery control system as claimed in claim 1,
 wherein the plurality of battery monitoring control circuits include a first battery monitoring control circuit, a second battery monitoring control circuit, and a third battery monitoring control circuit,
 wherein the communication interface of the first battery monitoring control circuit is connected to the communication interface of the second battery monitoring control circuit, and another communication interface of the second battery monitoring control circuit is connected to the communication interface of the third battery monitoring control circuit,
 wherein, after the first battery monitoring control circuit starts the second battery monitoring control circuit by transmitting the start-up signal to the second battery monitoring control circuit, and
 wherein the started second battery monitoring control circuit starts the third battery monitoring control circuit by transmitting the start-up signal to the third battery monitoring control circuit.

6. The battery control system as claimed in claim 1,
 wherein the power converter comprises an AC-DC converter configured using a diode or a transistor.

7. The battery control system as claimed in claim 6,
 wherein the power converter further comprises a charge-pump circuit that boosts an output voltage of the AC-DC converter.

8. The battery control system as claimed in claim 7,
wherein the power converter further includes a signal generator that generates a clock signal based on the start-up signal inputted to the communication interface, and
wherein the charge-pump circuit is driven by the clock signal.

9. The battery control system as claimed in claim 1, wherein the battery monitoring control circuit is provided in a cell control unit.

* * * * *